(12) United States Patent
Liu et al.

(10) Patent No.: US 11,283,013 B2
(45) Date of Patent: Mar. 22, 2022

(54) RESISTIVE MEMORY DEVICE AND MANUFACTURING METHOD THEREOF

(71) Applicant: United Semiconductor (Xiamen) Co., Ltd., Fujian (CN)

(72) Inventors: Yuheng Liu, Shamen (CN); Yunfei Fu, Shamen (CN); Chih-Chien Huang, Tainan (TW); Kuo-Liang Huang, Hsinchu (TW); Wen Yi Tan, Fujian (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 0 days.

(21) Appl. No.: 16/905,858

(22) Filed: Jun. 18, 2020

(65) Prior Publication Data
US 2021/0359204 A1 Nov. 18, 2021

(30) Foreign Application Priority Data
May 12, 2020 (CN) .......................... 202010395986.2

(51) Int. Cl.
*H01L 45/00* (2006.01)

(52) U.S. Cl.
CPC .......... *H01L 45/1233* (2013.01); *H01L 45/08* (2013.01); *H01L 45/1608* (2013.01); *H01L 45/146* (2013.01)

(58) Field of Classification Search
CPC ... H01L 45/1233; H01L 45/08; H01L 45/146; H01L 45/1608
See application file for complete search history.

(56) References Cited

U.S. PATENT DOCUMENTS

| 10,446,746 | B1 | 10/2019 | Reznicek | |
|---|---|---|---|---|
| 2009/0272962 | A1* | 11/2009 | Kumar | H01L 45/1641 257/4 |
| 2011/0297927 | A1* | 12/2011 | Ramaswamy | H01L 45/1233 257/43 |
| 2012/0267598 | A1* | 10/2012 | Sakotsubo | H01L 45/1608 257/4 |

(Continued)

FOREIGN PATENT DOCUMENTS

| CN | 101364634 A | 2/2009 |
|---|---|---|
| CN | 103107283 A | 5/2013 |

(Continued)

*Primary Examiner* — Shih Tsun A Chou
(74) *Attorney, Agent, or Firm* — Winston Hsu

(57) ABSTRACT

A resistive memory device includes a first electrode, a second electrode, a first metal oxide layer, a second metal oxide layer, and a multilayer insulator structure. The first metal oxide layer is disposed between the first electrode and the second electrode in a vertical direction. The second metal oxide layer is disposed between the first metal oxide layer and the second electrode in the vertical direction. The multilayer insulator structure is disposed between the first metal oxide layer and the second metal oxide layer in the vertical direction. The first metal oxide layer includes first metal atoms, the second metal oxide layer includes second metal atoms, and the multilayer insulator structure includes third metal atoms. Each of the third metal atoms is identical to each of the second metal atoms, and an atomic percent of the third metal atoms in the multilayer insulator structure gradually changes in the vertical direction.

10 Claims, 10 Drawing Sheets

(56) References Cited

U.S. PATENT DOCUMENTS

| | | | |
|---|---|---|---|
| 2015/0008388 A1 | 1/2015 | Kawasaki | |
| 2015/0060753 A1* | 3/2015 | Hsueh | H01L 45/085 257/4 |
| 2016/0225987 A1* | 8/2016 | Huang | H01L 45/08 |
| 2019/0341546 A1* | 11/2019 | Reznicek | H01L 45/146 |

FOREIGN PATENT DOCUMENTS

| | | |
|---|---|---|
| CN | 103606625 A | 2/2014 |
| CN | 104067391 A | 9/2014 |
| CN | 104347799 A | 2/2015 |
| CN | 109119532 A | 1/2019 |
| TW | 201214673 A1 | 4/2012 |
| TW | 201637255 A | 10/2016 |

* cited by examiner

RESISTIVE MEMORY DEVICE AND MANUFACTURING METHOD THEREOF

BACKGROUND OF THE INVENTION

1. Field of the Invention

The present invention relates to a resistive memory device and a manufacturing method thereof, and more particularly, to a resistive memory device including a multilayer insulator structure and a manufacturing method thereof.

2. Description of the Prior Art

Semiconductor memory devices are used in computer and electronics industries as a means for retaining digital information or data. Typically, the semiconductor memory devices are divided into volatile and non-volatile memory devices. The volatile memory device is a computer memory that loses its stored data when power to the operation is interrupted. Comparatively, in the non-volatile memory device, the stored data will not be lost when the power supply is interrupted. The resistive random access memory is a kind of non-volatile memory technology having the characteristics of low operating voltage, low power consumption, and high writing speed and is regarded as a memory structure that can be applied to many electronic devices.

SUMMARY OF THE INVENTION

A resistive memory device and a manufacturing method thereof are provided in the present invention. The related characteristics of the resistive memory device may be improved by a multilayer insulator structure having a concentration of metal atoms changing gradually.

According to an embodiment of the present invention, a resistive memory device is provided. The resistive memory device includes a first electrode, a second electrode, a first metal oxide layer, a second metal oxide layer, and a multilayer insulator structure. The first metal oxide layer is disposed between the first electrode and the second electrode in a vertical direction. The second metal oxide layer is disposed between the first metal oxide layer and the second electrode in the vertical direction. The multilayer insulator structure is disposed between the first metal oxide layer and the second metal oxide layer in the vertical direction. The first metal oxide layer includes first metal atoms, the second metal oxide layer includes second metal atoms, and the multilayer insulator structure includes third metal atoms. Each of the third metal atoms is identical to each of the second metal atoms. An atomic percent (at. %) of the third metal atoms in the multilayer insulator structure gradually changes in the vertical direction.

According to an embodiment of the present invention, a manufacturing method of a resistive memory device is provided. The manufacturing method includes the following steps. Firstly, a first electrode is formed. A first metal oxide layer is formed on the first electrode, and the first metal oxide layer includes first metal atoms. A multilayer insulator structure is formed on the first metal oxide layer. A second metal oxide layer is formed on the multilayer insulator structure. The second metal oxide layer includes second metal atoms, the multilayer insulator structure includes third metal atoms, and each of the third metal atoms is identical to each of the second metal atoms. A second electrode is formed on the second metal oxide layer. The multilayer insulator structure is disposed between the first metal oxide layer and the second metal oxide layer in a vertical direction, and an atomic percent (at. %) of the third metal atoms in the multilayer insulator structure gradually changes in the vertical direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 5-9 are schematic drawings illustrating a manufacturing method of a resistive memory device according to an embodiment of the present invention, wherein FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, and FIG. 9 is a schematic drawing in a step subsequent to FIG. 8.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
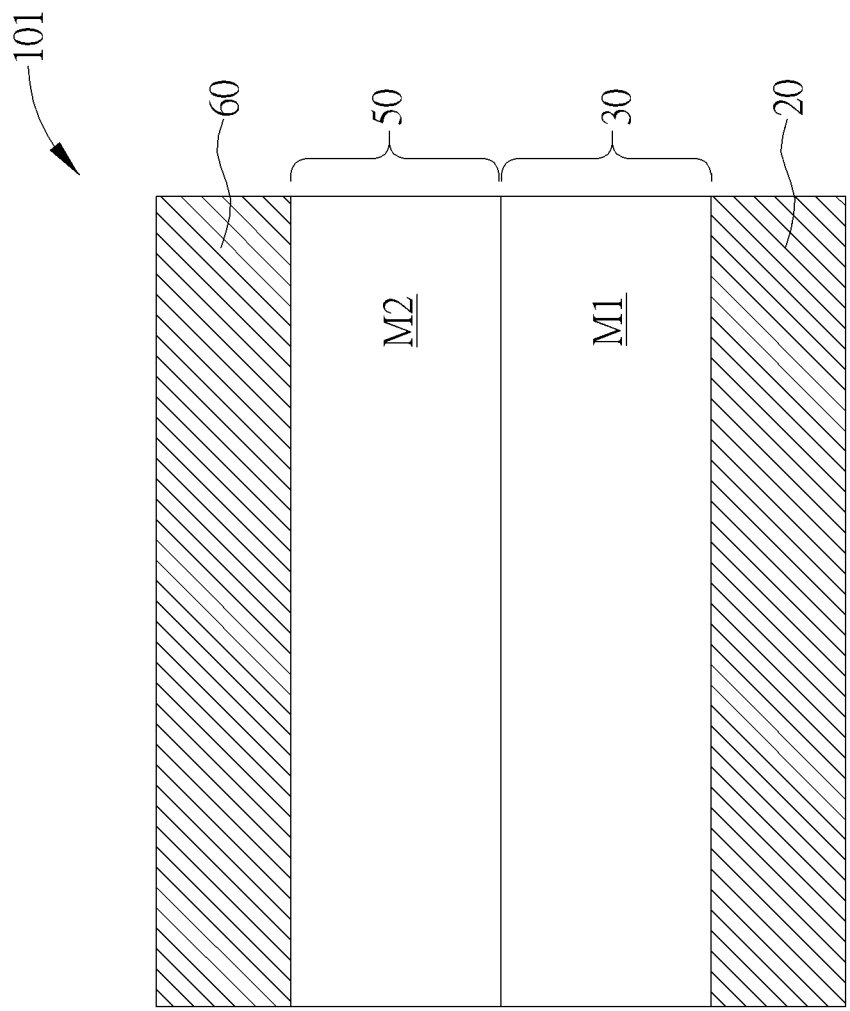
FIG. 1 is a schematic drawing illustrating a resistive memory device according to a first embodiment of the present invention.

Please refer to FIG. 1. FIG. 1 is a schematic drawing illustrating a resistive memory device 101 according to a first embodiment of the present invention. As shown in FIG. 1, the resistive memory device 101 includes a first electrode 20, a second electrode 60, a first metal oxide layer 30, and a second metal oxide layer 50. The first electrode 20 and the second electrode 60 are disposed corresponding to each other in a vertical direction Z, and the first metal oxide layer 30 and the second metal oxide layer 50 are disposed between the first electrode 20 and the second electrode 60 in the vertical direction Z. In some embodiments, the first metal oxide layer 30 and the second metal oxide layer 50 may be regarded as a switching medium in the resistive memory device 101. The electrical resistance of the resistive memory device 101 may be changed by applying suitable voltage to the first electrode 20 and/or the second electrode 60, and the resistive memory device 101 may switch to high resistance state (HRS) or low resistance state (LRS) for realizing the operation mode of the memory device, such as storing data, reading data, and resetting.

In some embodiments, the first electrode 20, the first metal oxide layer 30, the second metal oxide layer 50, and the second electrode 60 may be sequentially stacked in the vertical direction Z. Therefore, the bottom surface of the first metal oxide layer 30 may directly contact the first electrode 20, the top surface of the first meal oxide layer 30 may directly contact the bottom surface of the second metal oxide layer 50, and the top surface of the second metal oxide layer 50 may directly contact the second electrode 60, but not limited thereto. In addition, the material composition of the first metal oxide layer 30 may be different from the material composition of the second metal oxide layer 50. For example, the first metal oxide layer 30 may include a plurality of first metal atoms M1, the second metal oxide layer 50 may include a plurality of second metal atoms M2, and each of the first metal atoms M1 may be different from each of the second metal atoms M2. In some embodiments, the first metal oxide layer 30 may include a metal oxide with a chemical formula of $B_zO_t$, wherein B represents the first metal atom M1 described above, O represents oxygen atom, and z and t respectively represent the number of atoms of the first metal atom M1 and oxygen atom in the chemical formula of this metal oxide, but not limited thereto. Additionally, in some embodiments, the second metal oxide layer 50 may include a metal oxide with a chemical formula of $A_xO_y$, wherein A represents the second metal atom M2 described above, O represents oxygen atom, and x and y respectively represent the number of atoms of the second metal atom M2 and oxygen atom in the chemical formula of this metal oxide, but not limited thereto.

In some embodiments, the first metal oxide layer 30 and the second metal oxide layer 50 contact each other at the interface, and the region adjacent to the interface between the first metal oxide layer 30 and the second metal oxide layer 50 may be influenced by diffusion effect. Apart from the region adjacent to the interface between the first metal oxide layer 30 and the second metal oxide layer 50, the first metal oxide layer 30 may be substantially an oxide of the first metal atom M1 (such as $B_zO_t$ described above), and the second metal oxide layer 50 may be substantially an oxide of the second metal atom M2 (such as $A_xO_y$ described above). In other words, there may not be any second metal atom M2 disposed in the first metal oxide layer 30, and there may not be any first metal atom M1 disposed in the second metal oxide layer 50; or there may not be any second metal atom M2 disposed in a region within the first metal oxide layer 30, wherein the region within the first metal oxide layer 30 occupied 90% of the total volume of the first metal oxide layer 30, and there may not be any first metal atom M1 disposed in a region within the second metal oxide layer 50, wherein the region within the second metal oxide layer 50 occupied 90% of the total volume of the second metal oxide layer 50, but not limited thereto. In some embodiments, the first metal atom M1 and the second metal atom M2 described above may respectively include zinc (Zn), nickel (Ni), titanium (Ti), tantalum (Ta), aluminum (Al), or other suitable metal atoms. In some embodiments, the first electrode 20 and the second electrode 60 may respectively include a conductive material, such as platinum (Pt), tungsten (W), silver (Ag), copper (Cu), titanium, tantalum, an alloy of the material described above, a conductive nitride of the material described above, or other suitable electrically conductive materials. In addition, the first electrode 20 and the second electrode 60 may be regarded as an anode and a cathode in the resistive memory device 101 respectively, but not limited thereto.

Figure 2:
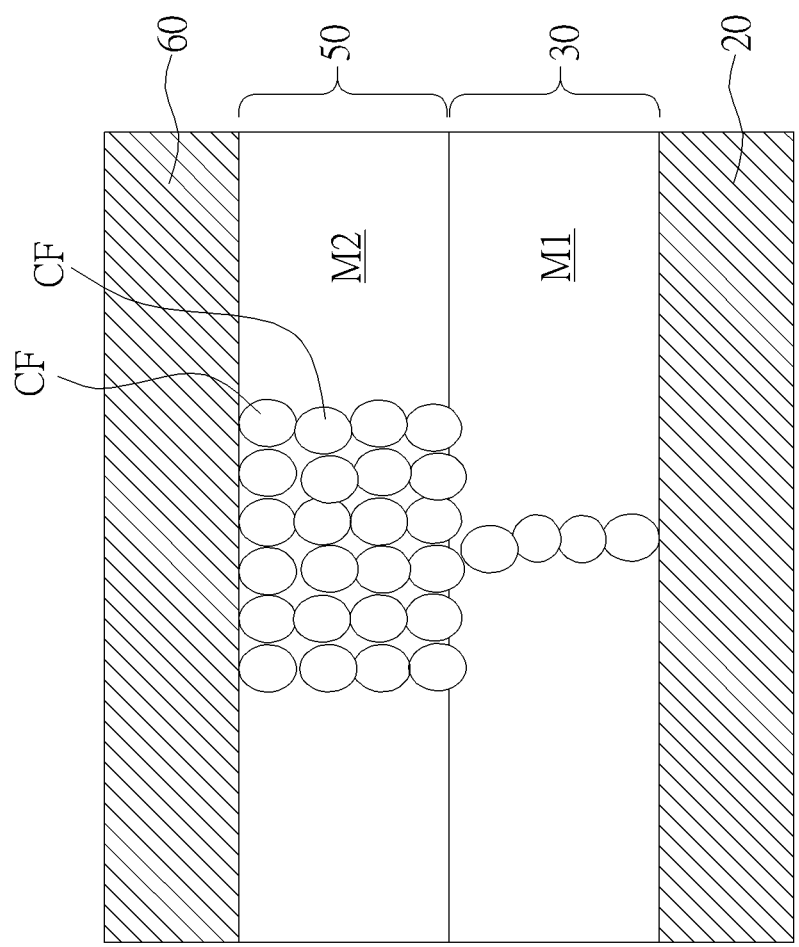
FIG. 2 is a schematic drawing illustrating an operation of the resistive memory device in the first embodiment of the present invention.

Please refer to FIG. 2. FIG. 2 is a schematic drawing illustrating an operation of the resistive memory device in the first embodiment of the present invention. As shown in FIG. 2, in some embodiments, a plurality of conducting filaments (or conductive filaments) CF may be formed in the first metal oxide layer 30 and the second metal oxide layer 50 by applying suitable voltage to the first electrode 20 and/or the second electrode 60. An electrical conductive path may be formed between the first electrode 20 and the second electrode 60 with the conducting filaments CF connected with one another, and the resistive memory device may switch from high resistance state to low resistance state accordingly. In some embodiments, the conducting filaments may be formed of oxygen vacancies in the first metal oxide layer 30 and the second metal oxide layer 50, but not limited thereto. In some embodiments, other types of conducting filaments (such as conducting filaments formed of metal ions) may be employed for providing the operation effect described above.

In some embodiments, the first metal oxide layer 30 and the second metal oxide layer 50 may be different from each other in their ability to generate oxygen vacancies when voltage is applied because the first metal atom M1 in the first metal oxide layer 30 is different from the second metal atom M2 in the second metal oxide layer 50, and the amount and/or the distribution of the conducting filaments CF formed in the first metal oxide layer 30 may be different from the amount and/or the distribution of the conducting filaments CF formed in the second metal oxide layer 50. For example, when the oxygen vacancies are less likely to be formed in the oxide of the first metal atom M1, there will be less conducting filaments CF formed in the first metal oxide layer 30, the conducting filament CF may be connected with another conducting filament CF in the first metal oxide layer 30 by point-to point contact only, and the conducting filament CF in the first metal oxide layer 30 may be connected with the conducting filament CF in the second metal oxide layer 50 by point-to point contact only. It will be difficult to control the operation voltage and/or the operation current of the resistive memory device under the situation described above, and the operation performance of the resistive memory device (such as endurance) will be negatively influenced.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 3:
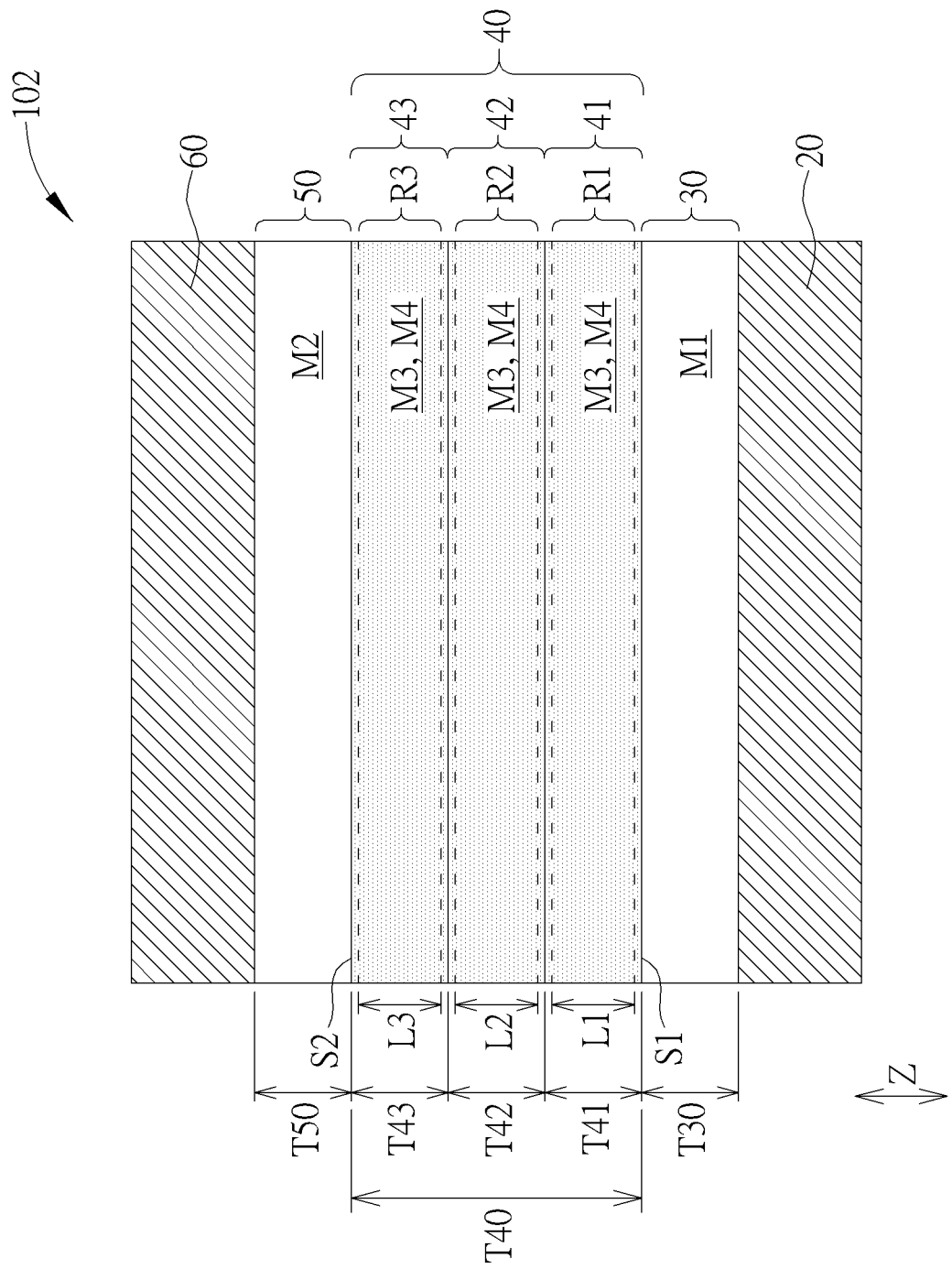
FIG. 3 is a schematic drawing illustrating a resistive memory device according to a second embodiment of the present invention.

Please refer to FIG. 3. FIG. 3 is a schematic drawing illustrating a resistive memory device 102 according to a second embodiment of the present invention. As shown in FIG. 3, the resistive memory device 102 includes the first electrode 20, the second electrode 60, the first metal oxide layer 30, the second metal oxide layer 50, and a multilayer insulator structure 40. The first metal oxide layer 30 is disposed between the first electrode 20 and the second electrode 60 in the vertical direction Z. The second metal oxide layer 50 is disposed between the first metal oxide layer 30 and the second electrode 60 in the vertical direction Z. The multilayer insulator structure 40 is disposed between the first metal oxide layer 30 and the second metal oxide layer 50 in the vertical direction Z. The first metal oxide layer 30 includes the first metal atoms M1, the second metal oxide layer 50 includes the second metal atoms M2, and the multilayer insulator structure 40 includes a plurality of third metal atoms M3. Each of the third metal atoms M3 is identical to each of the second metal atoms M2. An atomic percent (at. %) of the third metal atoms M3 in the multilayer insulator structure 40 gradually changes in the vertical direction Z. The condition of conducting filaments formed during the operation of the resistive memory device 102 may be modified by disposing the multilayer insulator structure 40 between the first metal oxide layer 30 and the second metal oxide layer 50 with the concentration of the third metal atoms M3 in the multilayer insulator structure 40 gradually changing in the vertical direction Z, and the related characteristics of the resistive memory device 102 may be improved accordingly.

In some embodiments, the multilayer insulator structure 40 may have a first surface S1 and a second surface S2 opposite to the first surface S1 in the vertical direction Z, the first surface S1 may contact and be directly connected with the first metal oxide layer 30, and the second surface S2 may contact and be directly connected with the second metal oxide layer 50, but not limited thereto. In some embodiment, an atomic percent of the second metal atoms M2 in the second metal oxide layer 50 may be higher than the atomic percent of the third metal atoms M3 in the multilayer insulator structure 40, and the atomic percent of the third metal atoms M3 in the multilayer insulator structure 40 may gradually increase from the first surface S1 to the second surface S2. In other words, the atomic percent of the third metal atoms M3 in a region disposed within the multilayer insulator structure 40 and disposed adjacent to the second metal oxide layer 50 may be higher than the atomic percent of the third metal atoms M3 in another region disposed within the multilayer insulator structure 40 and disposed away from the second metal oxide layer 50, and the atomic percent of the third metal atoms M3 in all regions within the multilayer insulator structure 40 is lower than the atomic percent of the second metal atoms M2 in the second metal oxide layer 50.

In some embodiments, the multilayer insulator structure 40 may include a plurality of metal oxide insulator layers (such as a first layer 41, a second layer 42, and a third layer 43 shown in FIG. 3) stacked with one another in the vertical direction Z. For example, the first layer 41 of the multilayer insulator structure 40 may be disposed between the first metal oxide layer 30 and the second layer 42 of the multilayer insulator structure 40 in the vertical direction Z, and the third layer 43 of the multilayer insulator structure 40 may be disposed between the second metal oxide layer 50 and the second layer 42 of the multilayer insulator structure 40 in the vertical direction Z. The first layer 41 of the multilayer insulator structure 40 may contact and be directly connected with the first metal oxide layer 30, the second layer 42 of the multilayer insulator structure 40 may contact and be directly connected with the first layer 41 and the third layer 43 respectively, and the third layer 43 of the multilayer insulator structure 40 may contact and be directly connected with the second metal oxide layer 50, but not limited thereto.

In some embodiments, the third metal atoms M3 in the multilayer insulator structure 40 may be distributed over each layer of the multilayer insulator structure 40, and the atomic percent of the third metal atoms M3 in the multilayer insulator structure 40 may gradually increase from the first surface S1 to the second surface S2. For example, an atomic percent of the third metal atoms M3 in the second layer 42 may be higher than an atomic percent of the third metal atoms M3 in the first layer 41, an atomic percent of the third metal atoms M3 in the third layer 43 may be higher than the atomic percent of the third metal atoms M3 in the second layer 42, and the atomic percent of the third metal atoms M3 in the third layer 43 may be lower than the atomic percent of the second metal atoms M2 in the second metal oxide layer 50.

In some embodiments, the multilayer insulator structure 40 may further include a plurality of fourth metal atoms M4, each of the fourth metal atoms M4 may be identical to each of the first metal atoms M1, and an atomic percent of the first metal atoms M1 in the first metal oxide layer 30 may be higher than an atomic percent of the fourth metal atoms M4 in the multilayer insulator structure 40. In some embodiments, the fourth metal atoms M4 in the multilayer insulator structure 40 may be distributed over each layer of the multilayer insulator structure 40, and the atomic percent of the fourth metal atoms M4 in the multilayer insulator structure 40 may gradually decrease from the first surface S1 to the second surface S2. For example, an atomic percent of the fourth metal atoms M4 in the first layer 41 may be higher than an atomic percent of the fourth metal atoms M4 in the second layer 42, an atomic percent of the fourth metal atoms M4 in the second layer 42 may be higher than the atomic percent of the fourth metal atoms M4 in the third layer 43, and the atomic percent of the fourth metal atoms M4 in the first layer 41 may be lower than the atomic percent of the first metal atoms M1 in the first metal oxide layer 30. In other words, in some embodiments, each layer of the multilayer insulator structure 40 (such as the first layer 41, the second layer 42, and the third layer 43) may be a metal oxide layer formed of the first metal atoms M3 and the fourth metal atoms M4, but the atomic percent of the third metal atoms M3 and the fourth metal atoms M4 in the layers may be different from one another. In some embodiments, the multilayer insulator structure 40 may be formed of two metal oxide insulator layers (such as the first layer 41 and the second layer 42 described above) only or be formed of four or more metal oxide insulator layers.

In some embodiments, the first layer 41 of the multilayer insulator structure 40 may include a metal oxide with a chemical formula of $A_{x-x1}B_{x1}O_{y1}$, the second layer 42 of the multilayer insulator structure 40 may include a metal oxide with a chemical formula of $A_{x-x2}B_{x2}O_{y2}$, the third layer 43 of the multilayer insulator structure 40 may include a metal oxide with a chemical formula of $A_{x-x3}B_{x3}O_{y3}$, the first metal oxide layer 30 may include a metal oxide with a chemical formula of $B_zO_t$, and the second metal oxide layer 50 may include a metal oxide with a chemical formula of $A_xO_y$, but not limited thereto. In the formulas described above, A represents the second metal atom M2 or the third metal atom M3 described above, B represents the first metal atom M1 or the fourth metal atom M4 described above, and O represents oxygen atom. In addition, x1 and y1 respectively represent the number of atoms of the fourth metal atom M4 and oxygen atom in the chemical formula of the metal oxide in the first layer 41 of the multilayer insulator structure 40, and x-x1 represents the number of atoms of the third metal atom M3 in the chemical formula of the metal oxide in the first layer 41 of the multilayer insulator structure 40; x2 and y2 respectively represent the number of atoms of the fourth metal atom M4 and oxygen atom in the chemical formula of the metal oxide in the second layer 42 of the multilayer insulator structure 40, and x-x2 represents the number of atoms of the third metal atom M3 in the chemical formula of the metal oxide in the second layer 42 of the multilayer insulator structure 40; and x3 and y3 respectively represent the number of atoms of the fourth metal atom M4 and oxygen atom in the chemical formula of the metal oxide in the third layer 43 of the multilayer insulator structure 40, and x-x3 represents the number of atoms of the third metal atom M3 in the chemical formula of the metal oxide in the third layer 43 of the multilayer insulator structure 40. In some embodiments, x1 may be greater than x2, x2 may be greater than x3, x-x1 may be less than x-x2, x-x2 may be less than x-x3, and y1, y2, and y3 may be equal to one another, but not limited thereto. In some embodiments, at least two selected from a group consisted of y1, y2, y3, and y described above may be different from each other according to some design considerations.

In some embodiments, the first metal oxide layer 30, the first layer 41, the second layer 42, and the third layer 43 of the multilayer insulator structure 40, and the second metal oxide layer 50 contact one another at the interfaces, and the regions adjacent to the interfaces between the first metal oxide layer 30, the first layer 41, the second layer 42, and the third layer 43 of the multilayer insulator structure 40, and the second metal oxide layer 50 may be influenced by diffusion effect. Apart from the regions adjacent to the interfaces described above, the first layer 41 of the multilayer insulator structure 40 may be substantially the metal oxide with a chemical formula of $A_{x-x1}B_{x1}O_{y1}$ only, the second layer 42 of the multilayer insulator structure 40 may be substantially the metal oxide with a chemical formula of $A_{x-x2}B_{x2}O_{y2}$ only, and the first layer 43 of the multilayer insulator structure 40 may be substantially the metal oxide with a chemical formula of $A_{x-x3}B_{x3}O_{y3}$ only. For example, the atomic percent of the third metal atoms M3 in the first layer 41 and the atomic percent of the fourth metal atoms M4 in the first layer 41 described above (such as the atomic percent in the chemical formula of $A_{x-x1}B_{x1}O_{y1}$) may exist in a first region R1 within the first layer 41; the atomic percent of the third metal atoms M3 in the second layer 42 and the atomic percent of the fourth metal atoms M4 in the second layer 42 described above (such as the atomic percent in the chemical formula of $A_{x-x2}B_{x2}O_{y2}$) may exist in a second region R2 within the second layer 42; the atomic percent of the third metal atoms M3 in the third layer 43 and the atomic percent of the fourth metal atoms M4 in the third layer 43 described above (such as the atomic percent in the chemical formula of $A_{x-x3}B_{x3}O_{y3}$) may exist in a third region R3 within the third layer 43; and the first region R1, the second region R2, and the third region R3 may not be directly connected with one another, but not limited thereto. In some embodiments, the metal oxide with the chemical formula of $A_{x-x1}B_{x1}O_{y1}$ may be uniformly distributed over the first region R1 within the first layer 41, the metal oxide with the chemical formula of $A_{x-x2}B_{x2}O_{y2}$ may be uniformly distributed over the second region R2 within the second layer 42, and the metal oxide with the chemical formula of $A_{x-x3}B_{x3}O_{y3}$ may be uniformly distributed over the third region R3 within the third layer 43, but not limited thereto. In some embodiments, a length L1 of the first region R1 in the vertical direction Z may be greater than or equal to 90% of a thickness T41 of the first layer 41 in the vertical direction Z, a length L2 of the second region R2 in the vertical direction Z may be greater than or equal to 90% of a thickness T42 of the second layer 42 in the vertical direction Z, and a length L3 of the third region R3 in the vertical direction Z may be greater than or equal to 90% of a thickness T43 of the third layer 43 in the vertical direction Z, but not limited thereto.

Additionally, in some embodiments, a thickness T40 of the multilayer insulator structure 40 in the vertical direction Z may be greater than a thickness T30 of the first metal oxide layer 30 in the vertical direction Z and a thickness T50 of the second metal oxide layer 50 in the vertical direction Z. The thickness T41, the thickness T42, and the thickness T43 described above may be greater than or equal to the thickness T30 and the thickness T50 respectively, and the length L1, the length L2, and the length L3 described above may also be greater than or equal to the thickness T30 and the thickness T50 respectively, but not limited thereto. It is worth noting that the atomic percent of each element in each layer may be obtained by energy dispersive spectrometer (EDS), other suitable analysis approaches, and/or measurements with other suitable analysis apparatus. In addition, the resistive memory device in the present invention may include resistive random-access memory (ReRAM) or other types of resistive memory.

Figure 4:
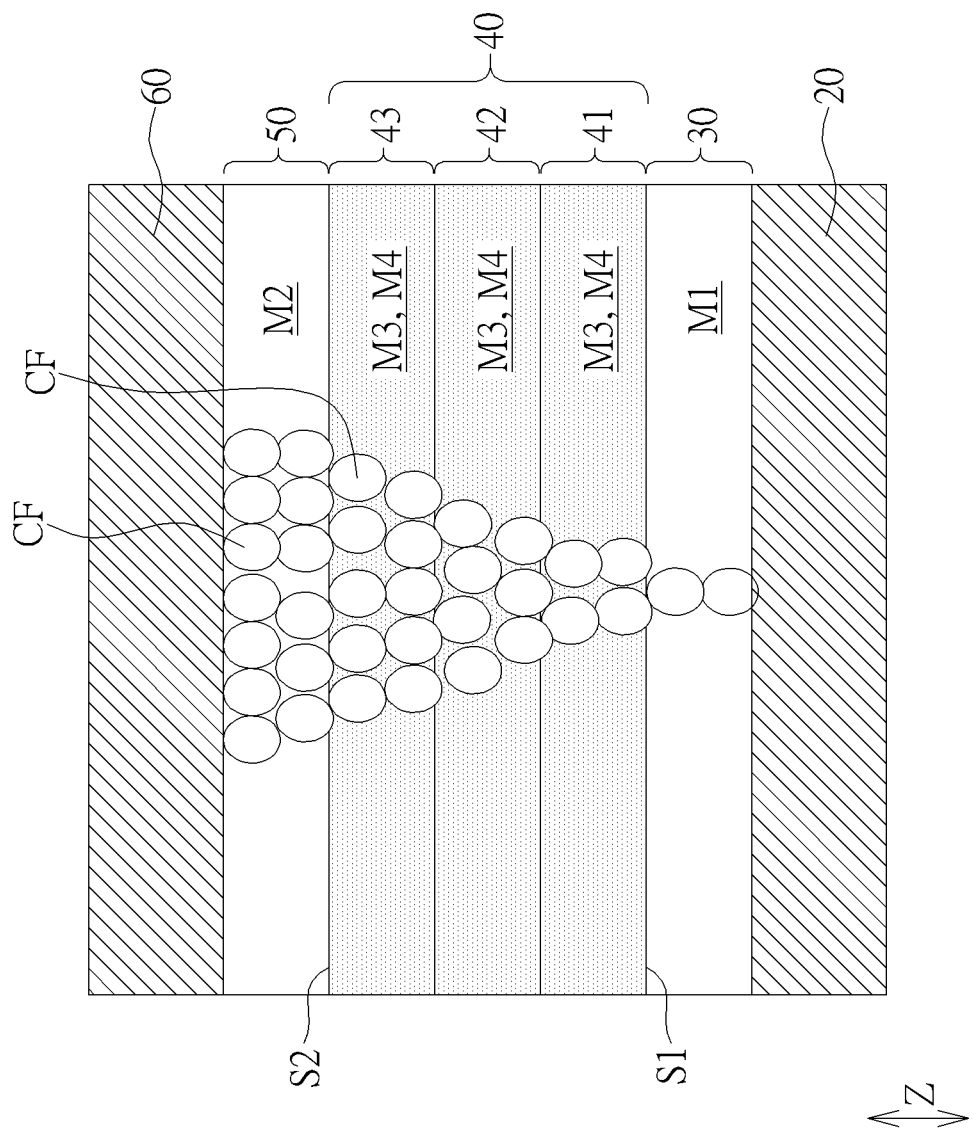
FIG. 4 is a schematic drawing illustrating an operation of the resistive memory device in the second embodiment of the present invention.

Please refer to FIG. 4. FIG. 4 is a schematic drawing illustrating an operation of the resistive memory device in the second embodiment of the present invention. As shown in FIG. 4, in some embodiments, the distribution of the conducting filaments CF formed in the operation may be triangular or funnel-shaped by disposing the multilayer insulator structure 40 between the first metal oxide layer 30 and the second metal oxide layer 50 with the concentrations of the third metal atoms M3 and the fourth metal atoms M4 changing gradually in the vertical direction Z. The related characteristics of the resistive memory device 102 may be improved accordingly. For example, the control of the operation voltage and/or the operation current of the resistive memory device and the related operation performance of the resistive memory device (such as endurance) may be improved accordingly, but not limited thereto.

Figure 5:
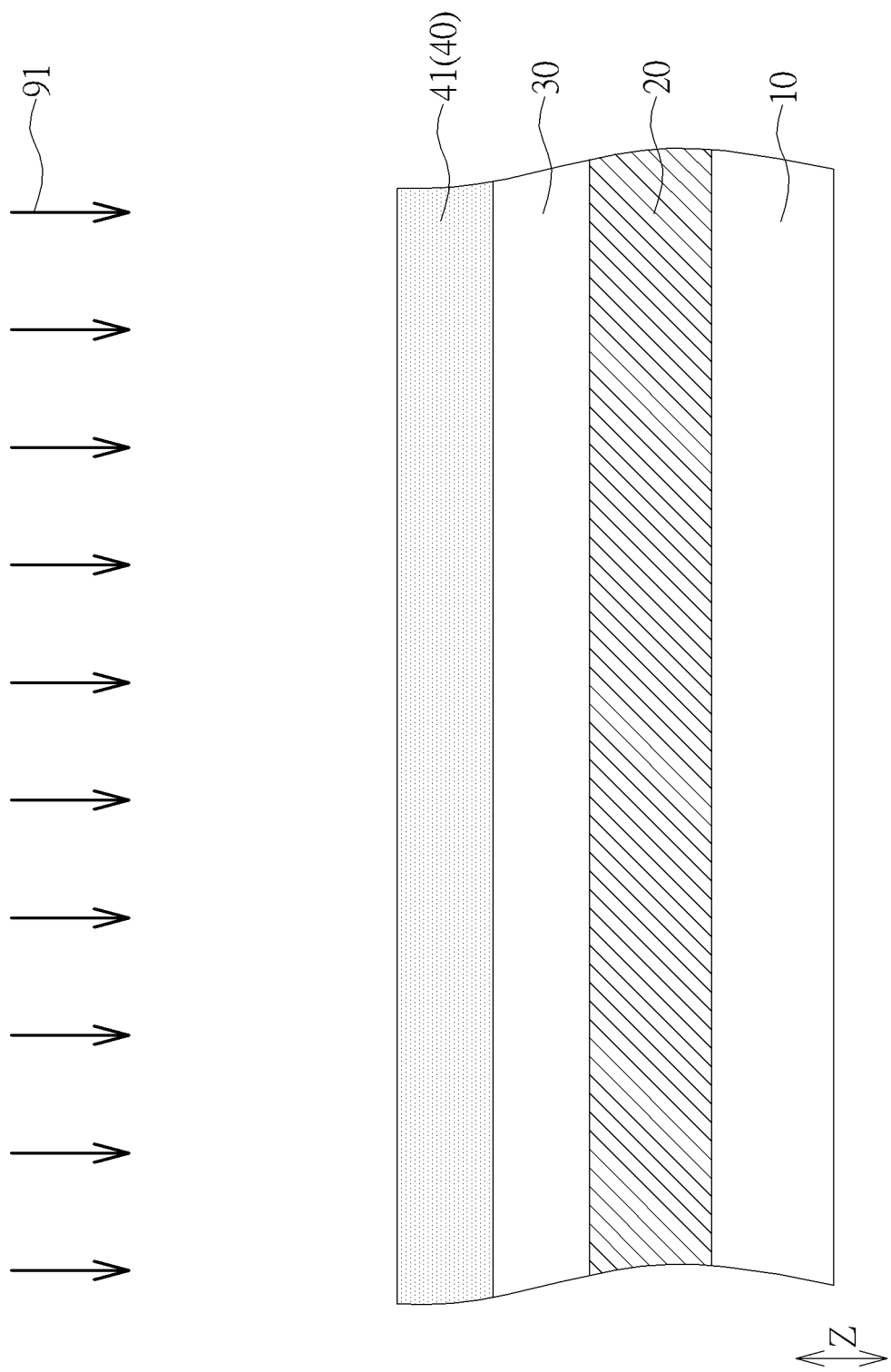
Figure 6:
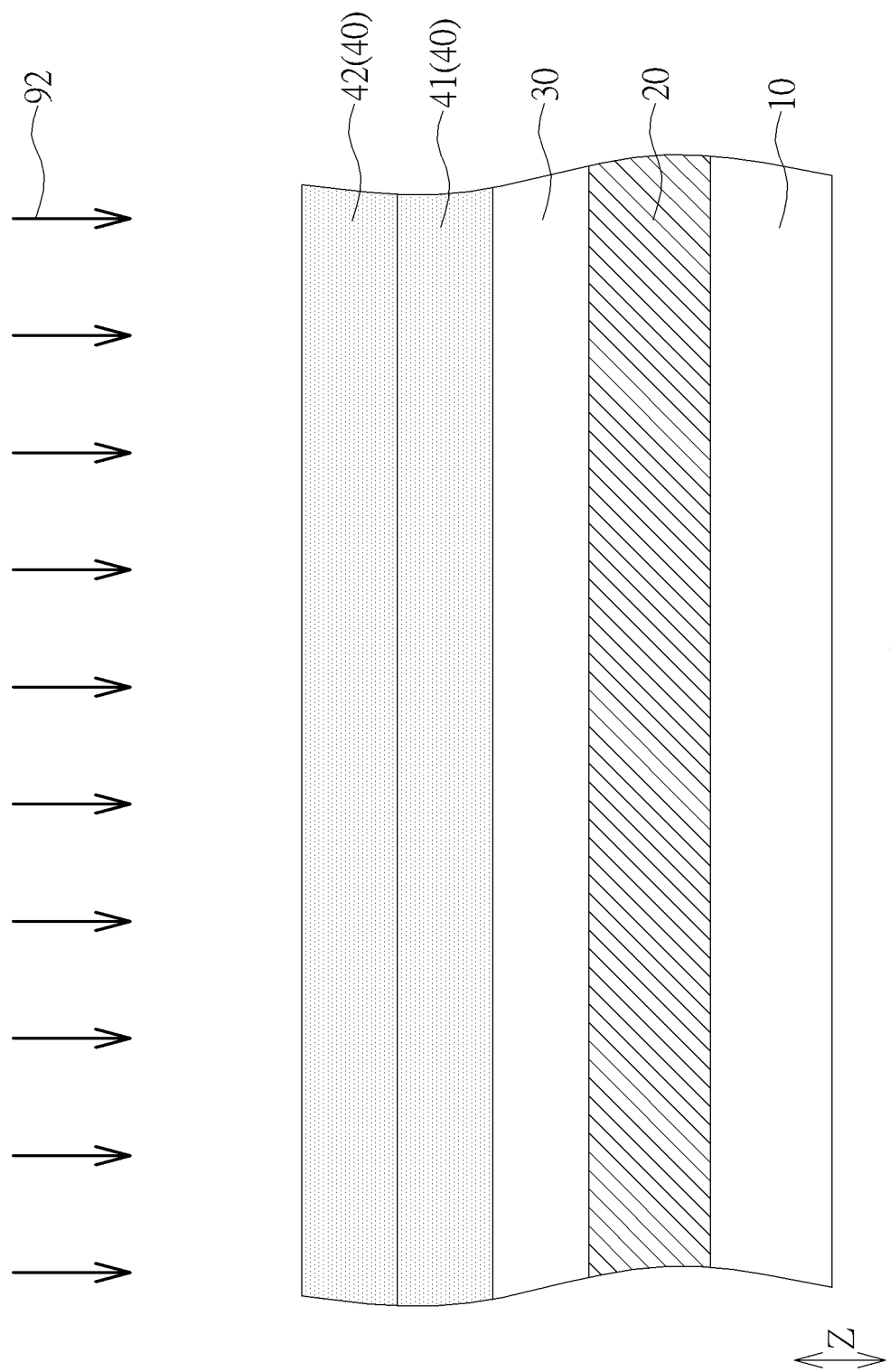
Figure 7:
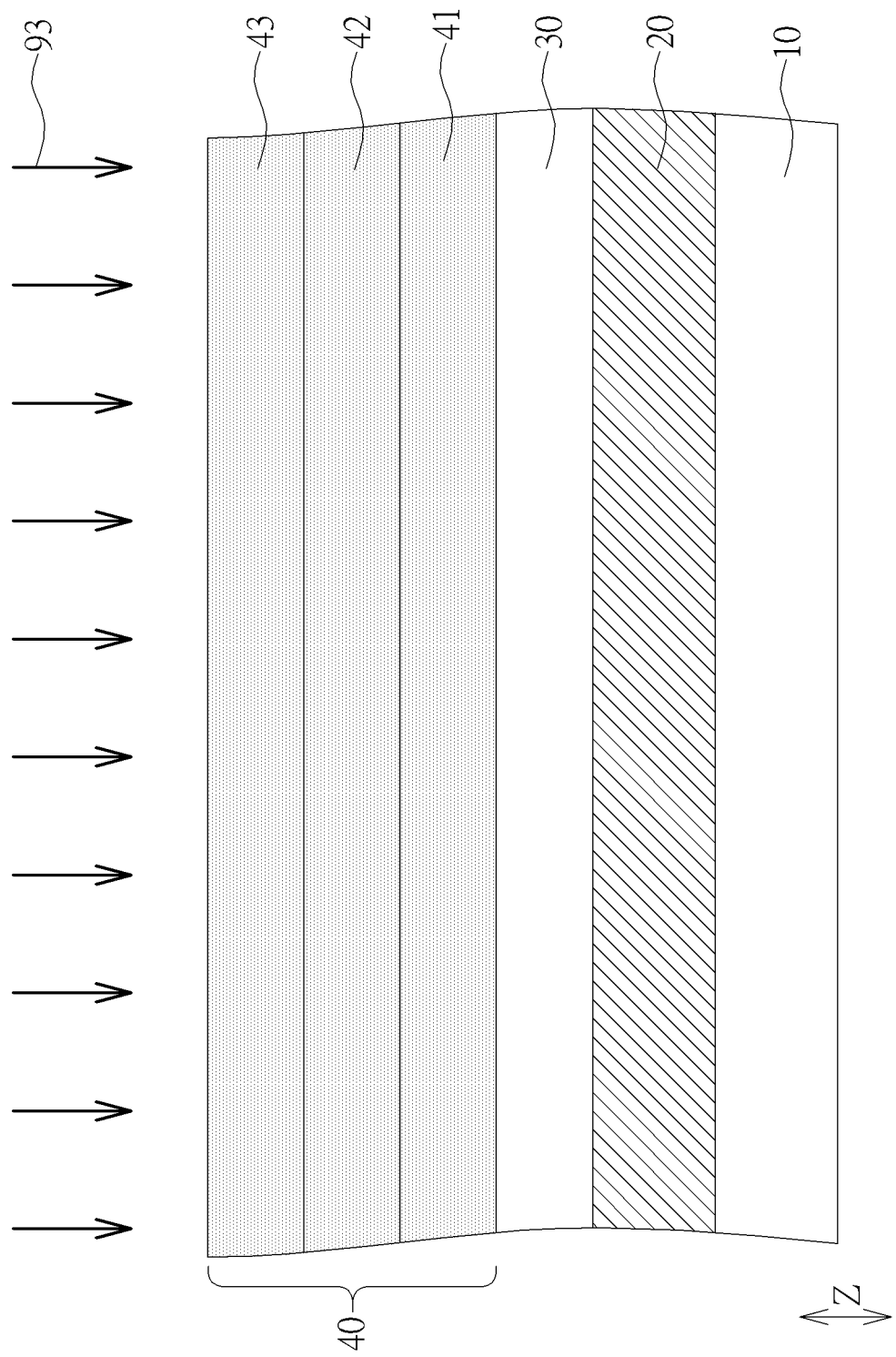
Figure 8:
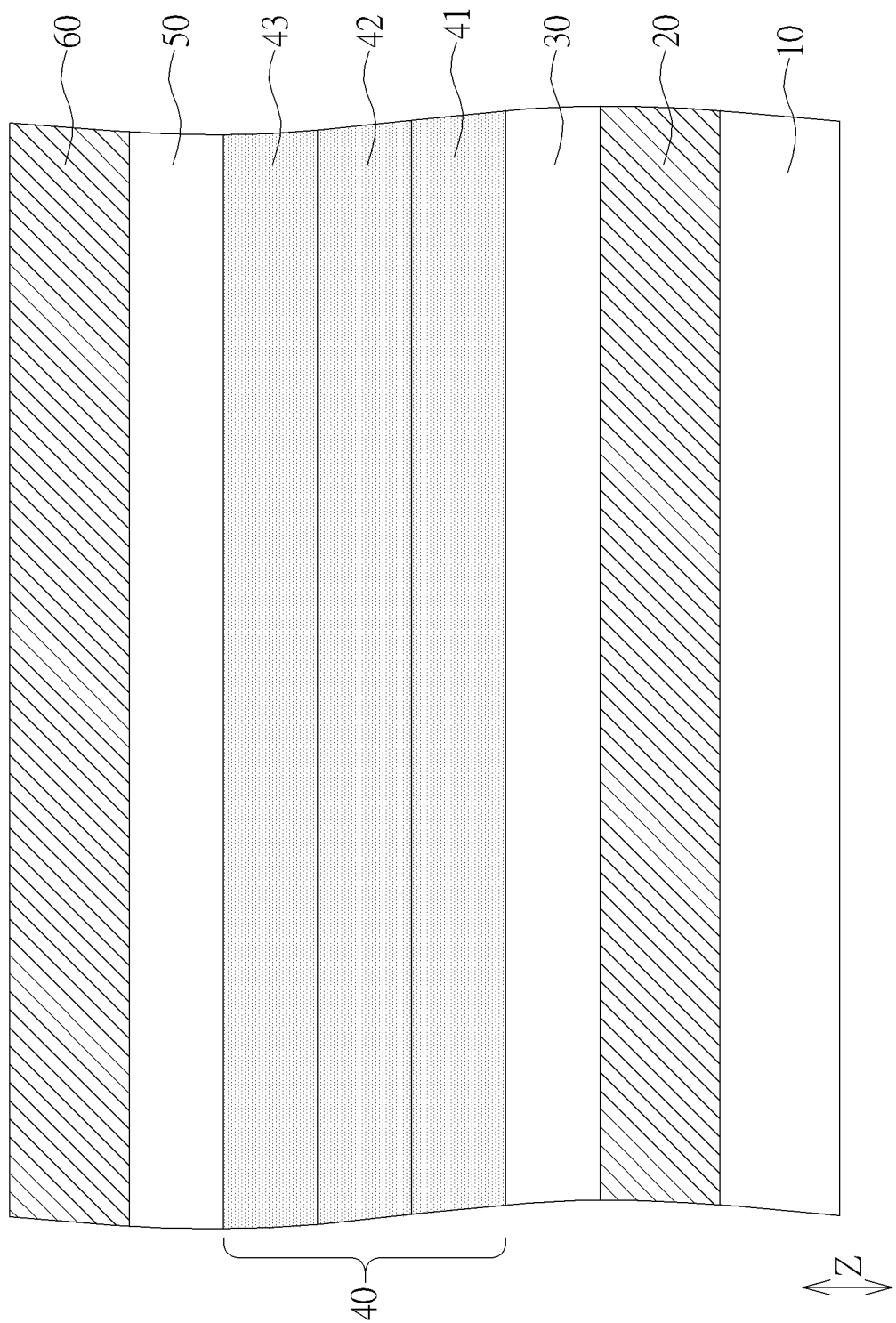
Figure 9:
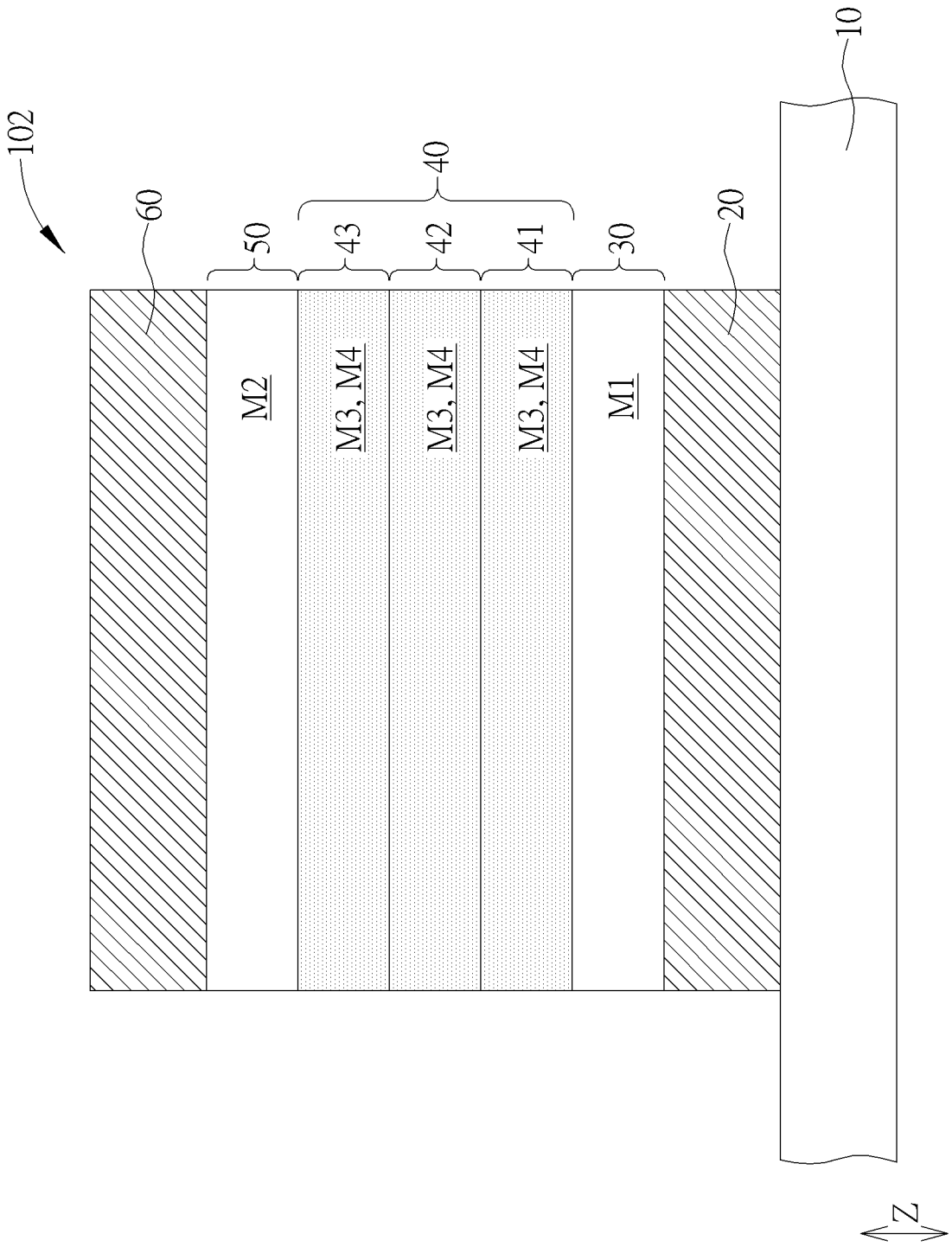

Please refer to FIGS. 5-9. FIGS. 5-9 are schematic drawings illustrating a manufacturing method of a resistive memory device according to an embodiment of the present invention, wherein FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, and FIG. 9 is a schematic drawing in a step subsequent to FIG. 8. As shown in FIG. 9, the manufacturing method of the resistive memory device 102 may include the following steps. Firstly, the first electrode 20 is formed. The first metal oxide layer 30 is formed on the first electrode 20, and the first metal oxide layer 30 includes the first metal atoms M1. The multilayer insulator structure 40 is formed on the first metal oxide layer 30. The second metal oxide layer 50 is formed on the multilayer insulator structure 40. The second metal oxide layer 50 includes the second metal atoms M2, the multilayer insulator structure 40 includes the third metal atoms M3, and each of the third metal atoms M3 is identical to each of the second metal atoms M2. The second electrode 60 is formed on the second metal oxide layer 50. The multilayer insulator structure 40 is disposed between the first metal oxide layer 30 and the second metal oxide layer 50 in the vertical direction Z, and the atomic percent of the third metal atoms M3 in the multilayer insulator structure 40 gradually changes in the vertical direction Z.

Specifically, the manufacturing method in this embodiment may include but is not limited to the following steps. Firstly, as shown in FIG. 5, the first electrode 20, the first metal oxide layer 30 and the multilayer insulator structure 40 are sequentially formed on a dielectric layer 10. In some embodiments, the dielectric layer 10 may include silicon oxide, silicon nitride, silicon oxynitride, or other suitable dielectric materials. The dielectric layer 10 may be formed on a substrate (not shown), and the substrate may include a semiconductor substrate, such as a silicon substrate, a silicon germanium semiconductor substrate, a silicon-on-insulator (SOI) substrate, or a substrate made of other suitable materials, but not limited thereto. In addition, before the step of forming the first electrode 20, other units (such as transistors) and/or other circuits (not shown) may be formed on the substrate described above, and the first electrode 20 may be electrically connected downwardly with the units and/or the circuits on the substrate via conductive structures (not shown) located in the dielectric layer 10, but not limited thereto. In some embodiments, the manufacturing method of the resistive memory device may be integrated with the back end of line (BEOL) process in the semiconductor manufacturing process, but not limited thereto.

In some embodiments, the first layer 41 of the multilayer insulator structure 40 may be formed on the first metal oxide layer 30 by a first process 91, and the first process 91 may include a deposition process, such as a chemical vapor deposition (CVD) process, a physical vapor deposition (PVD) process, an atomic layer deposition (ALD) process, or other suitable film forming processes. In addition, the first metal oxide layer 30 and the first electrode 20 may be formed by suitable film forming processes also, but the first process 91 used to form the first layer 41 of the multilayer insulator structure 40 and/or the process condition (such as reactants used in the process, targets used in the process, and so forth) may be different from the film forming process configured to form the first metal oxide layer 30 and/or the process condition of the film forming process configured to form the first metal oxide layer 30.

Subsequently, as shown in FIG. 5 and FIG. 6, the second layer 42 of the multilayer insulator structure 40 is formed on the first layer 41 of the multilayer insulator structure 40. The second layer 42 of the multilayer insulator structure 40 may be formed on the first layer 41 of the multilayer insulator structure 40 by a second process 92, and the second process 92 is performed after the first process 91. As shown in FIG. 6 and FIG. 7, the third layer 43 of the multilayer insulator structure 40 is then formed on the second layer 42 of the multilayer insulator structure 40. The third layer 43 of the multilayer insulator structure 40 may be formed on the second layer 42 of the multilayer insulator structure 40 by a third process 93, and the third process 93 may be performed after the second process 92. In other words, each layer in the multilayer insulator structure 40 may be formed by a corresponding film forming process. In some embodiments, the first process 91, the second process 92, and the third process 93 shown in FIGS. 5-7 described above may be the processes of the same type, and the first layer 41, the second layer 42, and the third layer 43 with different composition ratios may be obtained by modifying the process parameters. In some embodiments, the second process 92 and the third process 93 may include deposition process, such as CVD processes, PVD processes, ALD processes, or other suitable film forming processes.

Subsequently, as shown in FIG. 8, the second metal oxide layer 50 and the second electrode 60 are sequentially formed on the multilayer insulator structure 40. In other words, the multilayer insulator structure 40 may be formed before the step of forming the second metal oxide layer 50, and the multilayer insulator structure 40 is not an interfacial layer formed between the first metal oxide layer 30 and the second metal oxide layer 50 by diffusion. Subsequently, as shown in FIG. 8 and FIG. 9, a patterning process may be performed to the second electrode 60, the second metal oxide layer 50, the multilayer insulator structure 40, the first metal oxide layer 30, and the first electrode 20 for forming the resistive memory device 102 on the dielectric layer 10. In some embodiments, the second electrode 60, the second metal oxide layer 50, the multilayer insulator structure 40, the first metal oxide layer 30, and the first electrode 20 may also be patterned respectively by different patterning processes according to some design considerations, and the patterning process of each layer may be performed before the step of forming a material layer above this layer, but not limited thereto.

Figure 10:
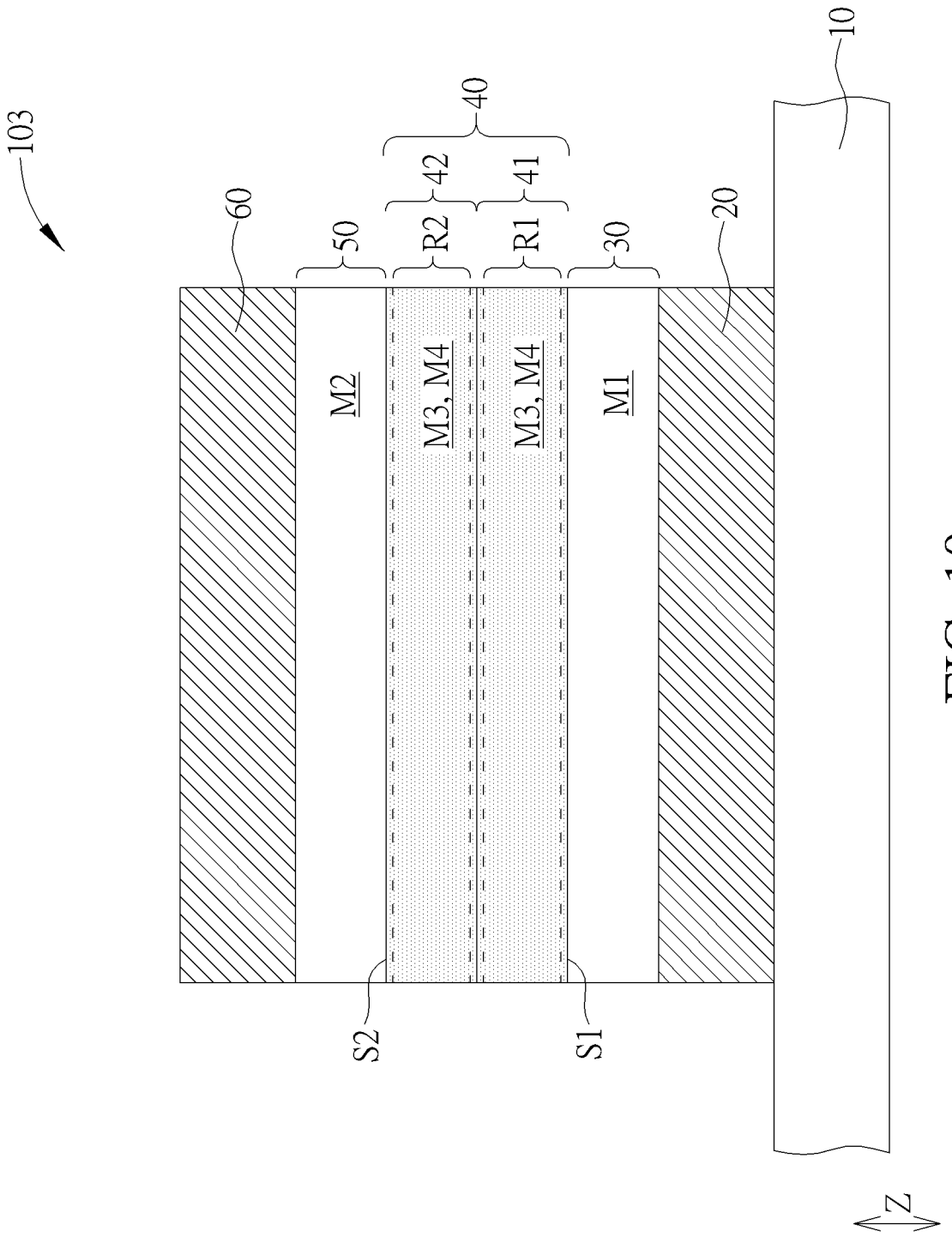
FIG. 10 is a schematic drawing illustrating a resistive memory device according to a third embodiment of the present invention.

Please refer to FIG. 10. FIG. 10 is a schematic drawing illustrating a resistive memory device 103 according to a third embodiment of the present invention. As shown in FIG. 10, in the resistive memory device 103, the first layer 41 of the multilayer insulator structure 40 may directly contact the first metal oxide layer 30, and the second layer 42 of the multilayer insulator structure 40 may directly contact the second metal oxide layer 50. In other words, the multilayer insulator structure 40 in this embodiment may be composed of two metal oxide insulator layers, and the multilayer insulator structure 40 with this design may provide operation effect similar to that shown in FIG. 4 described above.

To summarize the above descriptions, in the resistive memory device and the manufacturing method thereof according to the present invention, the distribution of the conducting filaments formed in the operation of the resistive memory device may be modified by disposing the multilayer insulator structure with the metal atom concentration changing gradually between two different metal oxide layers, and the related properties of the resistive memory device may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A resistive memory device, comprising:
   a first electrode;
   a second electrode;

a first metal oxide layer disposed between the first electrode and the second electrode in a vertical direction, wherein the first metal oxide layer comprises first metal atoms;

a second metal oxide layer disposed between the first metal oxide layer and the second electrode in the vertical direction, wherein the second metal oxide layer comprises second metal atoms, there is not any second metal atom disposed in the first metal oxide layer, and there is not any first metal atom disposed in the second metal oxide layer, wherein the first metal oxide layer is directly connected with the first electrode, and the second metal oxide layer is directly connected with the second electrode; and a multilayer insulator structure disposed between the first metal oxide layer and the second metal oxide layer in the vertical direction, wherein the multilayer insulator structure comprises third metal atoms, each of the third metal atoms is identical to each of the second metal atoms, and an atomic percent (at. %) of the third metal atoms in the multilayer insulator structure changes in the vertical direction, wherein a first layer of the multilayer insulator structure is disposed between the first metal oxide layer and a second layer of the multilayer insulator structure in the vertical direction, an atomic percent of the third metal atoms in the second layer is higher than an atomic percent of the third metal atoms in the first layer, and a thickness of the first layer is equal to a thickness of the second layer, wherein the multilayer insulator structure further comprises fourth metal atoms, and each of the fourth metal atoms is identical to each of the first metal atoms, wherein an atomic percent of the fourth metal atoms in the first layer is higher than an atomic percent of the fourth metal atoms in the second layer.

2. The resistive memory device according to claim 1, wherein an atomic percent of the second metal atoms in the second metal oxide layer is higher than the atomic percent of the third metal atoms in the multilayer insulator structure.

3. The resistive memory device according to claim 1, wherein the multilayer insulator structure has a first surface and a second surface opposite to the first surface in the vertical direction, the first surface is connected with the first metal oxide layer, and the second surface is connected with the second metal oxide layer.

4. The resistive memory device according to claim 3, wherein the atomic percent of the third metal atoms in the multilayer insulator structure increases from the first surface to the second surface.

5. The resistive memory device according to claim 3, wherein an atomic percent of the first metal atoms in the first metal oxide layer is higher than an atomic percent of the fourth metal atoms in the multilayer insulator structure, and the atomic percent of the fourth metal atoms in the multilayer insulator structure decreases from the first surface to the second surface.

6. The resistive memory device according to claim 1, wherein a thickness of the multilayer insulator structure in the vertical direction is greater than a thickness of the first metal oxide layer in the vertical direction and a thickness of the second metal oxide layer in the vertical direction, respectively.

7. The resistive memory device according to claim 1, wherein the atomic percent of the third metal atoms in the first layer exists in a first region within the first layer, and a length of the first region in the vertical direction is greater than or equal to 90% of the thickness of the first layer in the vertical direction.

8. The resistive memory device according to claim 1, wherein the atomic percent of the third metal atoms in the second layer exists in a second region within the second layer, and a length of the second region in the vertical direction is greater than or equal to 90% of the thickness of the second layer in the vertical direction.

9. The resistive memory device according to claim 1, wherein a third layer of the multilayer insulator structure is disposed between the second metal oxide layer and the second layer of the multilayer insulator structure in the vertical direction, and an atomic percent of the third metal atoms in the third layer is higher than the atomic percent of the third metal atoms in the second layer.

10. The resistive memory device according to claim 1, wherein a third layer of the multilayer insulator structure is disposed between the second metal oxide layer and the second layer of the multilayer insulator structure in the vertical direction, and the atomic percent of the fourth metal atoms in the second layer is higher than an atomic percent of the fourth metal atoms in the third layer.

* * * * *